United States Patent
Pance et al.

(10) Patent No.: US 8,390,481 B2
(45) Date of Patent: Mar. 5, 2013

(54) SENSING CAPACITANCE CHANGES OF A HOUSING OF AN ELECTRONIC DEVICE

(75) Inventors: Aleksandar Pance, Saratoga, CA (US); Nicholas Vincent King, San Jose, CA (US); Duncan Kerr, San Francisco, CA (US); Brett Bilbrey, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 818 days.

(21) Appl. No.: 12/542,354

(22) Filed: Aug. 17, 2009

(65) Prior Publication Data

US 2011/0037624 A1  Feb. 17, 2011

(51) Int. Cl.
*H03K 17/94* (2006.01)

(52) U.S. Cl. ............. 341/33; 341/34; 345/168; 345/173

(58) Field of Classification Search ............ 341/22, 341/33, 34; 178/18.06–18.07; 345/168, 345/173
See application file for complete search history.

(56) References Cited

U.S. PATENT DOCUMENTS

| | | | |
|---|---|---|---|
| 3,783,394 A | 1/1974 | Avery | |
| 4,310,840 A | 1/1982 | Williams et al. | |
| 4,539,554 A | 9/1985 | Jarvis et al. | |
| 5,008,497 A | 4/1991 | Asher | |
| 6,002,389 A * | 12/1999 | Kasser | 345/173 |
| 6,278,888 B1 | 8/2001 | Hayes, Jr. et al. | |
| 6,723,937 B2 | 4/2004 | Englemann et al. | |
| 7,006,078 B2 | 2/2006 | Kim | |
| 7,109,978 B2 | 9/2006 | Gillespie et al. | |
| 7,154,481 B2 * | 12/2006 | Cross et al. | 345/173 |
| 7,242,395 B2 | 7/2007 | Kurashima et al. | |
| 7,595,788 B2 * | 9/2009 | Son | 345/168 |
| 7,816,838 B2 | 10/2010 | Leskinen et al. | |
| 7,825,907 B2 * | 11/2010 | Choo et al. | 345/173 |
| 2006/0290677 A1 | 12/2006 | Lyon et al. | |
| 2007/0046637 A1 * | 3/2007 | Choo et al. | 345/169 |
| 2007/0242037 A1 * | 10/2007 | Son | 345/156 |
| 2009/0002199 A1 | 1/2009 | Lainonen et al. | |
| 2011/0175813 A1 | 7/2011 | Sarwar et al. | |

* cited by examiner

*Primary Examiner* — Khai M Nguyen (57) ABSTRACT

Methods and apparatuses are disclosed that allow measurement of a user's interaction with the housing of an electronic device. Some embodiments may measure the electrical characteristics of a housing of an electrical device, where the housing is capable of being temporarily deformed by the user's interaction. By measuring the electrical characteristics of the housing, such as the housing's capacitance, the user's interaction with the housing can be measured in a manner that is independent of the user's electrical characteristics and/or in a manner that may allow the pressure applied to the housing to be quantified.

24 Claims, 11 Drawing Sheets

SENSING CAPACITANCE CHANGES OF A HOUSING OF AN ELECTRONIC DEVICE

CROSS-REFERENCE TO RELATED APPLICATIONS

This application is related to, and incorporates by reference, the application titled "Housing as I/O" and identified as Ser. No. 12/542,471 and the application titled "Electronic Device Housing as an Acoustic Input Device" and identified as Ser. No. 12/542,386, both of which were filed on the same date as this application.

BACKGROUND

I. Technical Field

The present invention relates generally to utilizing a housing of an electronic device as an input device, and more particularly to methods and apparatuses that provide measurement of a user's interaction with the housing of the electronic device.

II. Background Discussion

Electronic devices are ubiquitous in society and can be found in everything from wristwatches to computers. Depending upon the particular implementation of the electronic device, each device may have a different mechanism for interfacing with a user. Some electronic devices, such as laptop computers and mobile telephones, have dedicated portions of the device that include a standard keyboard where the user enters data by pressing one or more separate physical keys on the keyboard. However, as electronic devices and consumers become more sophisticated, many consumers prefer electronic devices with more aesthetically pleasing interface mechanisms. These aesthetically pleasing interfaces include touch pads and/or touch screens that do not have keys, buttons or other input mechanisms that physically protrude from the keyboard. Due to the lack of a conventional keyboard or other input mechanism, the user generally depresses certain designated areas of the touch pads and/or touch screens to interface with the electronic device. For example, many mobile telephones have touch screen interfaces, so that the user can contact with an area on the screen with a finger to enter a desired telephone number.

Conventional electronic devices often implement these touch pads and/or touch screens by relying upon capacitive coupling between the designed area of the device and a user. For example, in some conventional electronic devices, the capacitance or inductance of the user's hand or finger is measured to determine whether the user has made contact with the touch pad and/or touch screen. Unfortunately, there are many cases where the electrical characteristics of the user may provide an inaccurate representation of user's contact with the electrical device. For example, if the user is already touching or resting his hand on the touch pad and/or touch screen, then conventional electronic devices may already have measured this capacitance or inductance and be incapable of noticing the additional touch from the user. Also, the accuracy of measuring the electrical characteristics of the user may be compromised if the user's hand is not free of contaminants, (e.g., if the user has dirt or grease on his hands or his hand is sweaty). Furthermore, because conventional electronic devices register a user touching the touch pad and/or touch screen by detecting for the user's capacitance or inductance, conventional electronic devices are often incapable of determining the amount of pressure applied to the electronic device because the user's capacitance or inductance is generally unrelated to the pressure applied. Accordingly, methods and apparatuses that provide measurement of a user's interaction with the housing of an electronic device may be useful.

SUMMARY

Embodiments are disclosed that allow measurement of a user's interaction with the housing of an electronic device. Some embodiments may measure a change in the electrical characteristics of a housing of an electrical device when the housing is temporarily stressed, and thus at least slightly deformed, by the user's interaction with the housing. By measuring the electrical characteristics of the housing, such as the housing's capacitance, both before and during user interaction, the user's interaction can be sensed in a manner that is independent of the user's electrical characteristics and/or in a manner that may allow a pressure applied to the housing by the user to be quantified.

Some embodiments may include an input-output device that includes a metal surface and one or more sensors disposed adjacent the metal surface. The one or more sensors may be configured to detect a deflection of the metal surface and indicate an input to the input-output device.

Some embodiments may take the form of an electronic device having a housing with a first region having a first thickness and a second region having a second thickness. The electronic device may further include a printed circuit board (PCB) coupled to the housing. Generally, the PCB may include a terminal located thereon and substantially aligned with the second region of the housing. The housing may further include a processing unit coupled to the PCB and operative to measure an electrical characteristic of the terminal with respect to the housing (or a change thereof).

Other embodiments may take the form of an electronic device having a housing with a substantially flat exterior and an interior having first and second areas with differing thicknesses. A PCB may be coupled to the housing and further to an illumination source aligned with the second area. The electronic device may further include a processing unit coupled to the PCB, where the processing unit may illuminate the illumination source when a minimum external stress is applied to the exterior of the housing.

Still other embodiments may take the form of a housing for an electronic device having a user input mechanism integrated into the housing. The electronic device may include a processing unit coupled to the housing and operative to sense or react to a stress applied to at least a specific area of an exterior of the housing.

BRIEF DESCRIPTION OF THE DRAWINGS

The use of the same reference numerals in different drawings indicates similar or identical items.

DETAILED DESCRIPTION OF THE INVENTION

Generally, electronic devices are implemented in a "housing" that structurally encloses the electronic device and protects it from being damaged. Embodiments of electronic devices are disclosed that allow a user to interact with an electronic device through their housings. More specifically, in some embodiments, the electronic devices may include one or more input-output (I/O) devices that are integrated into the surface of the housing rather than within the housing. That is, the housing may be part of the I/O system as well as the structural enclosure for the electronic device.

With regard to inputting data via the housing, the housing may include one or more sensors that are capable of detecting a variety of user actions as input to the electronic device. In other words, the housing itself may be used as an input device such that user actions like approaching, touching, tapping, holding, and/or squeezing the electronic device, may be used as input data by the electronic device. In some embodiments, the sensors in the housing also may be combined with one or more additional sensing devices to enhance the housing's ability to sense user actions. For example, the sensors in the housing may be used in conjunction with an accelerometer.

While conventional housings for electronic devices may be manufactured using different types of plastics, an increasing number of housings are being implemented where the housing is manufactured, in whole or in part, using metal. Conventional approaches have had difficulty sensing user interaction through metal, especially when the sensors are implemented using capacitive sensing technologies. In some embodiments, the difficulties associated with capacitive sensing may be overcome by forming the capacitive sensor using the housing as a first terminal of the capacitor, using another terminal located within the housing as a second terminal of the capacitor, and separating the first and second terminals to create a cavity or gap to be filled with dielectrics. As is described in greater detail below, these dielectrics may vary between different embodiments. For example in some embodiments, the dielectric may be air while in other embodiments the dielectric may be implemented as a material that offers additional structural support to the housing, such as a sponge.

Although one or more of the embodiments disclosed herein may be described in detail with reference to a particular electronic device, the embodiments disclosed should not be interpreted or otherwise used as limiting the scope of the disclosure, including the claims. In addition, one skilled in the art will understand that the following description has broad application. Accordingly, the discussion of any embodiment is meant only to be exemplary and is not intended to suggest that the scope of the disclosure, including the claims, is limited to these embodiments.

Figure 1A:
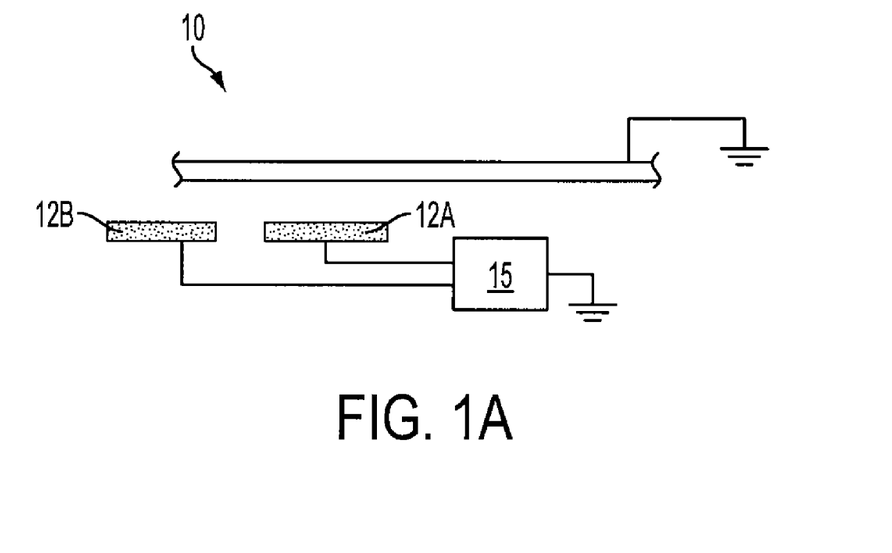
FIG. 1A illustrates an electronic device capable of detecting touch sensing through the housing.

Turning now to FIG. 1A, a housing 10 is shown that is capable of enclosing an electronic device. Although only a portion of the housing 10 is shown in FIG. 1A, the housing 10 may be part of a larger enclosure of an electronic device. For example, the housing 10 may be part of one or more surfaces of an enclosure for an electronic device, such as one or more walls. In some embodiments, the housing 10 may be manufactured solely using metallic materials such as anodized aluminum, steel, titanium or other metals, while in other embodiments, the housing 10 may be formed using combinations of metallic and non-metallic materials, or combinations of different metallic materials.

Figure 1B:
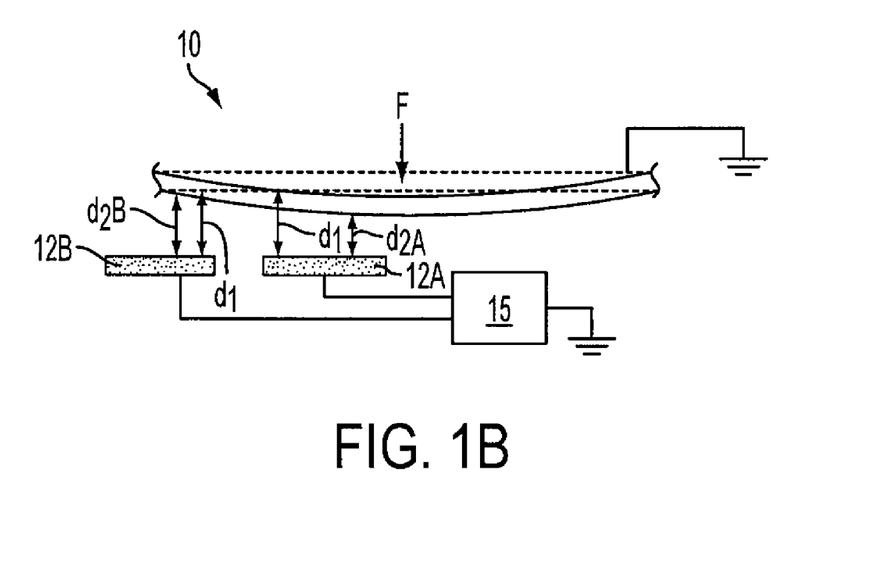
FIG. 1B illustrates the housing shown in FIG. 1A being deflected.

As shown in FIG. 1A, the housing 10 may couple to one or more terminals 12A and 12B that are located within the housing 10 at a predetermined distance from the housing 10 (shown as $d_1$ in FIG. 1B). While different portions of the housing 10 may be manufactured, to varying degree using both metallic and non-metallic materials, the portions of the housing 10 that are adjacent to the terminals 12A and 12B may be made of metal so as to form a capacitor with the combination of the housing 10 and the terminals 12A and 12B. That is, the housing 10 may form a first terminal of the capacitor, the terminals 12A and 12B may form a second terminal of the capacitor, and the gap between the terminals 12A and 12B may form the dielectric for the capacitor.

In some embodiments, such as the one shown in FIG. 1A, the housing 10 may be electrically grounded and the terminals 12A and 12B may couple to a controller 15 that is also grounded. In other embodiments, the polarity of the capacitor connections may be reversed such that the housing 10 may be ungrounded and the terminals 12A and 12B may be grounded. Regardless of the particular electrical connections of the capacitor structure formed by the combination of the housing 10 and the terminals 12A and 12B, as the housing is stressed or deflected, the controller 15 may measure this deflection as a change in the capacitance of the capacitor formed by the combination of the housing 10 and each of the terminals 12A and 12B. That is, the terminal 12A may form a first capacitor structure with the housing 10 and the terminal 12B may form a second capacitor that is electrically separate from the first capacitor.

FIG. 1B illustrates a force F being imparted on the housing 10. This force F may be the result of a user's actions with respect to the electronic device, such as by touching, tapping, holding, and/or squeezing the electronic device. The controller 15 may measure this force F by measuring the change in spacing between the housing 10 and the various terminals 12A and 12B. In other words, as the housing 10 is deflected, the initial distance $d_1$ between each of the terminals 12A and 12B may decrease to $d_{2A}$ and $d_{2B}$ respectively, thereby changing the capacitance of the capacitor structure formed between each of the terminals 12A and 12B and the housing 10. The controller 15 also may determine the location of a majority of the force F by determining which of the terminals 12A and 12B experience the largest change in capacitance, indicating the largest deflection in the housing 10.

Figure 2:
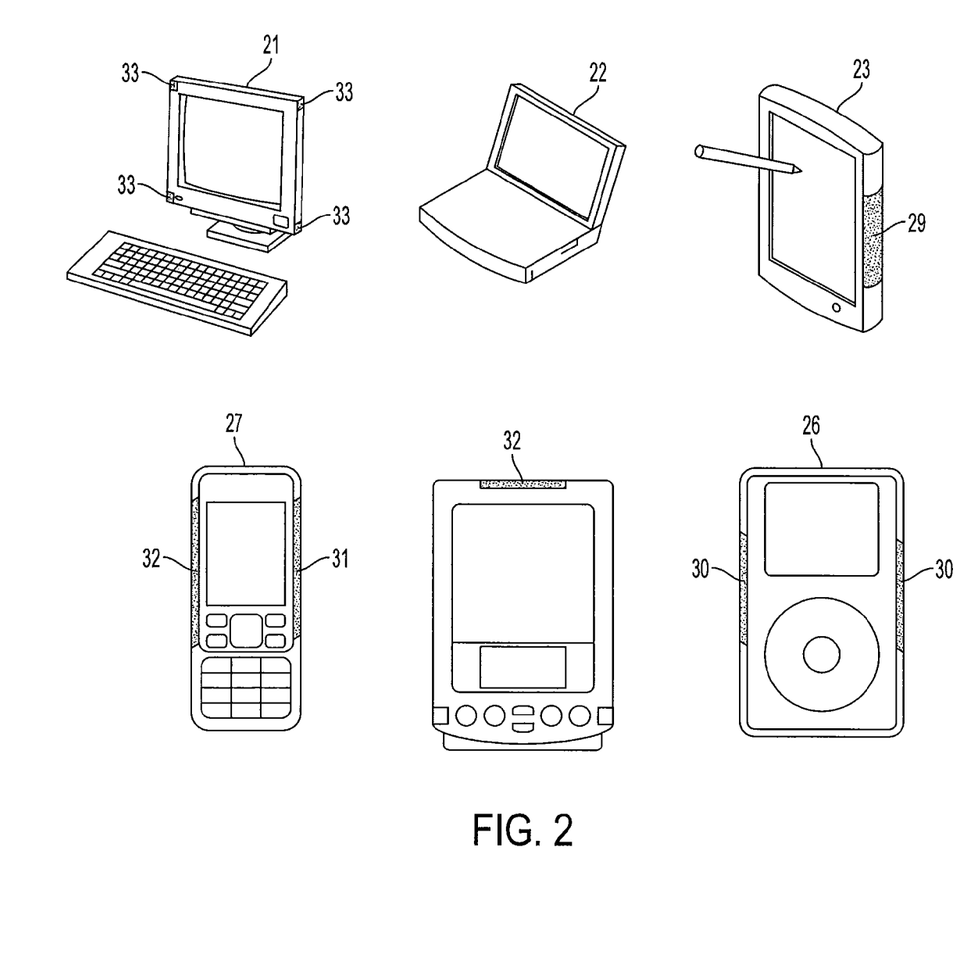
FIG. 2 illustrates various electronic devices that may employ the disclosed housing input mechanisms.

FIG. 2 illustrates some of the various electronic devices where the housing 10 may be implemented. These electronic devices may include a desktop computer 21, a notebook computer 22, a tablet computer 23, a personal digital assistant (PDA) 25, a media player 26, and/or a mobile telephone 27, to illustrate but a few. As shown, the notebook computer 22 may have a metallic solid continuous surface in place of a traditional keyboard.

Figure 3:
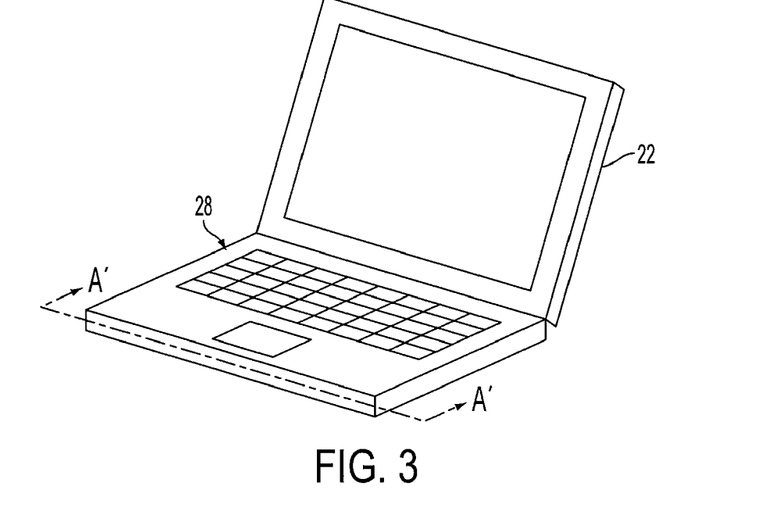
FIG. 3 illustrates a notebook that may employ the disclosed housing input mechanisms.

FIG. 3 illustrates the notebook computer 22 shown in FIG. 2 where a keyboard 28 (shown in phantom) is formed in the metallic solid surface. The keyboard 28 may be formed by orienting one or more terminals (such as the terminals 12A and 12B shown and described above in the context of FIG. 1), below each of the desired key locations of the keyboard 28. For example, FIG. 4A illustrates a top down view of a cross section of the keyboard 28 taken through the housing of the notebook computer 22 along the line AA' shown in FIG. 3.

Figure 4A:
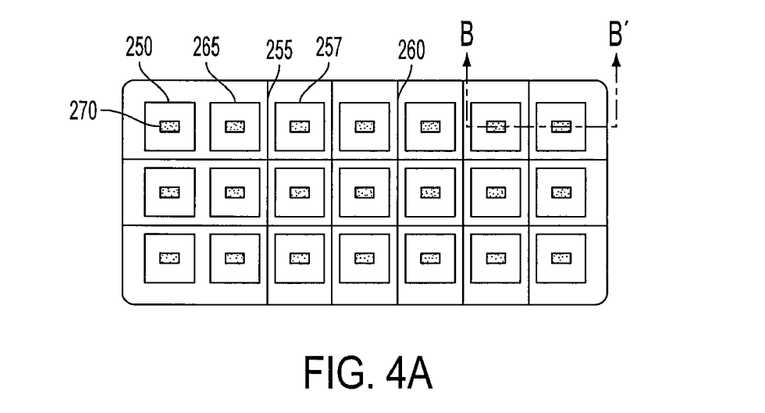
FIG. 4A illustrates a top down view of a cross section of the notebook from FIG. 3 taken along the line AA' shown in FIG. 3.

Referring now to FIG. 4A, a first terminal 250 may be mounted on a printed circuit board 255 in a location that generally corresponds with the keys of the keyboard 28 (shown in phantom in FIG. 2). In some embodiments, the first terminal 250 may be separated from other terminals, such as a second terminal 257, by a dielectric grid 260 (which is shown in greater detail below with regard to FIG. 5A). Accordingly, the first terminal 250 may couple to one key of the keyboard 28 while the second terminal 257 may couple to another key of the keyboard 28. In other embodiments, more than one terminal may be coupled to the same key. For example, the first terminal 250 may be coupled along with a third terminal 265 to the same key by being within the same portion of the dielectric grid 260 as shown. Also, some sections of the keyboard 28 may include more terminals per unit area than others, resulting in sections of the keyboard 28 with higher resolution than other sections of the keyboard 28.

Figure 4B:
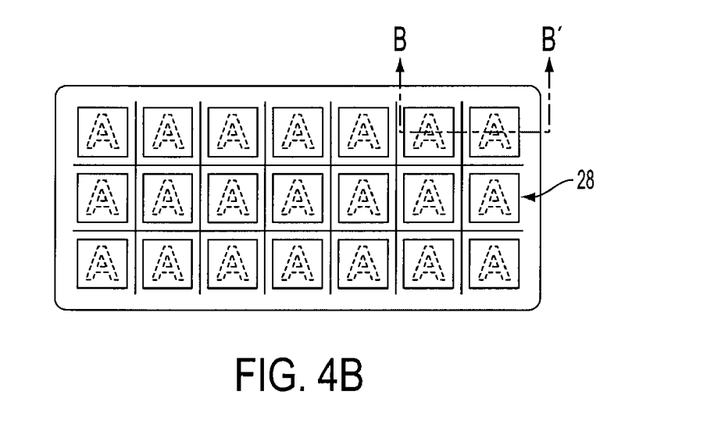
FIG. 4B illustrates a top down view of the notebook computer that may be located on top of the cross sectional view shown in FIG. 4A.

The printed circuit board 255 may include one or more light emitting diodes (LEDs) 270 located adjacent to the terminals 250, 257, and/or 265. FIG. 4B illustrates a top down view of the keyboard 28 that may be located on top of the view shown in FIG. 4A. As will be described in greater detail below, the keys of the keyboard 28 may be integrated into the flat metallic surface of the housing using micro-perforations to define the edges of the keys and the letters associated with each key (both shown with dotted lines in FIG. 4B). In this manner, as the LEDs 270 are illuminated the locations of the keys and the letters they represent may become apparent to the user. Alternatively, the thickness and/or opacity of the housing 105 may be controlled by controlling the amount of metal sputtered on the surface of the housing 105.

Figure 5A:
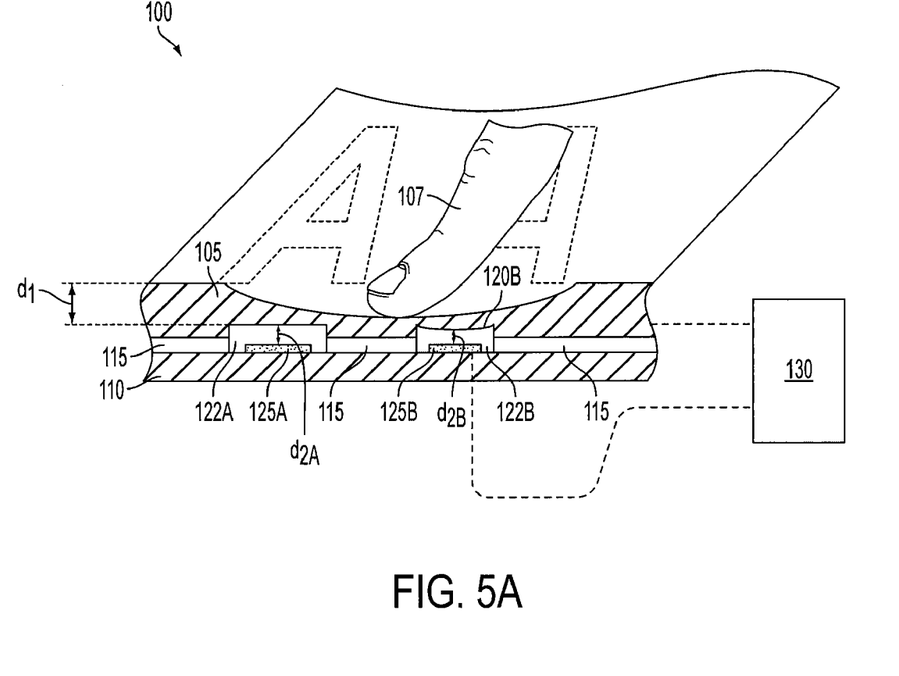
FIG. 5A illustrates a cross section of a housing input mechanism taken along the line BB' shown in FIG. 4B.
Figure 5B:
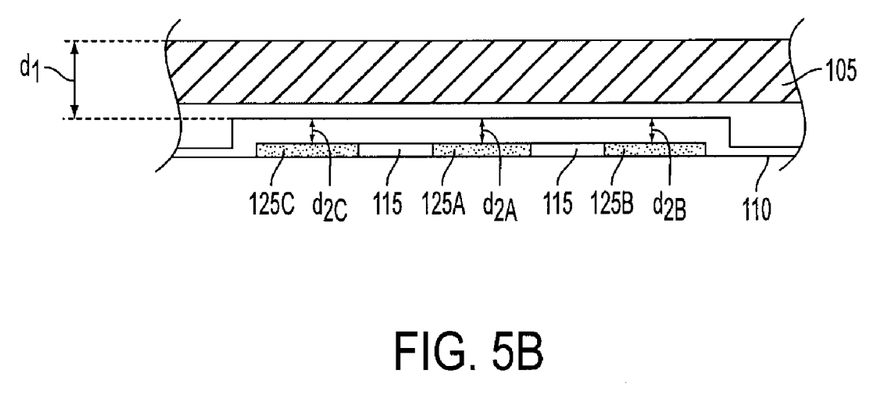
FIG. 5B illustrates an alternate embodiment of the housing input mechanism shown in FIG. 5A.

FIG. 5A illustrates a cross section of a housing input mechanism 100 taken through two keys of the notebook computer 22 along the line BB' shown in FIG. 4B, however, it should be appreciated that the cross section shown in FIG. 5A may represent the user inputs of any of the electronic devices shown in FIG. 2, such as two of the buttons on the mobile telephone 27. Additionally, the electronic devices that implement the housing input mechanism 100 may be combinations of these devices. For example, one embodiment may be a device that is a combination of a PDA, a media player and a mobile telephone. In fact, the housing input mechanism 100 may be integrated into any portion of the housing of a wide variety of consumer electronic devices, such as refrigerators, audio equipment, display devices, automobiles and other devices not specifically mentioned herein. Also, although the housing 105 is shown as a cross section, it should be appreciated that the housing 105 may be part of a larger enclosure of the electronic device, where the enclosure not only provides structural support and protection to the electronic device, but the housing 105 also forms part of a capacitive sensing device.

Depending upon the particular electronic device, the manner in which the housing input mechanism 100 is incorporated into the housing may vary. For example, in a notebook computer 22 the housing input mechanism may exist in place of a keyboard 28. In other embodiments, such as the PDA 25, the personal media player 26, and/or the mobile telephone 27, the housing input mechanism 100 may be incorporated into the portions of the devices 25-27 that typically make contact with a user's hand, such as portions 29, 30, 31, 32, and 33 respectively. As will be described in greater detail below, by incorporating the housing input mechanism 100 into the electronic devices in this manner, a user may be able to interact with the electronic device by exerting physical pressure on the housing of the device. For example, if the mobile telephone 27 is in the user's pocket and begins to ring, a user may simply squeeze or tap the mobile telephone (even through his pocket) to silence it. Alternatively, a user may be able to interact with the housing input mechanism 100 without actually making physical contact with the electronic device. For example, as will be described in greater detail below in the context of FIG. 9, if the housing input mechanism 100 is used in place of the traditional keyboard 28 of the notebook computer 22, then pressure waves that may arise from a user waving his hand over the keyboard 28 may provide the user interaction, e.g., waking up the notebook computer 22 from a sleep state.

Referring back to FIG. 5A, the housing input mechanism 100 may be part of a housing 105 used in any of the electronic devices shown in FIG. 2. In some embodiments, the housing 105 may be manufactured from a metal such as anodized aluminum, steel, titanium or other metals. In other embodiments, the housing 105 may be manufactured from a plastic, ceramic or other suitable material. Regardless of the material used for manufacturing the housing 105, in some embodiments, the housing is of sufficient ductility or flexibility to allow a user 107 to temporarily stress or bend the housing 105 locally at an area of contact without permanently distorting the housing 105. For example, in the embodiments where the housing 105 is manufactured using anodized aluminum, its thickness over the area of contact, labeled as $d_1$ in FIG. 5A, may be approximately 0.4 millimeters to allow this temporary bending. As will be described in detail below, since different processing circuitry may have varying sensitivity thresholds that should be exceeded to permit determining a change in capacitance or another electrical or physical feature of the housing, the amount of pressure necessary on the exterior of the housing 105 to effectuate user input may vary.

The housing 105 may couple to a printed circuit board (PCB) 110 through one or more insulator regions 115. In some embodiments, the PCB 110 may be manufactured using a thin lightweight plastic layer that is coated with indium-tin-oxide (ITO) and therefore the insulator regions 115 may simply be areas where there is no deposition of ITO on the plastic. In other embodiments, the insulator regions 115 may be removed altogether and the housing 105 may be situated down in the recesses between the terminals 125A and 125B without making contact with the PCB 110. In still other embodiments, the insulator regions 115 may be alternately removed so that every other terminal has an insulator between it and the next terminal.

In other embodiments, the PCB 110 may be manufactured using flexible printed circuit boards, such as a polyimide base with copper conductors, where there are no copper conductors present in the insulator regions 115. In still other embodiments, the PCB 110 may be manufactured using conductive material and the insulator regions 115 are deposited thereon.

As shown, the housing 105 may include one or more cavities 120A-B that are situated between the insulator regions 115. In this manner, when the housing 105, the insulator regions 115, and the PCB 110 are assembled together, one or more voids 122A-B are created between the housing 105 and the PCB 110. One or more terminals 125A-B may be placed on the PCB 110 in a position that aligns with the cavities 120A-B. In the embodiments where the PCB 110 is manufactured with an insulating material, the one or more terminals 125A-B may be formed by depositing conductive material on the PCB 110 inside the cavities 120A-B when the housing 105, the insulator regions 115, and the PCB 110 are assembled together.

In the embodiments where the PCB is implemented using ITO, the terminals 125A-B may be mounted on the bottom of the PCB 110 in order to allow electrical connections (shown in FIG. 5A as a dashed line) to be routed across the PCB 110 without electrically shorting the connections.

The assembled combination of the housing 105, the voids 122A-B, and the terminals 125A-B may form one or more capacitor structures used to detect user interaction. In other words, the top of the cavity 120A may form one terminal of a first capacitor, the terminal 125A may form the other terminal of the first capacitor, and the void 122A may form the dielectric material of the first capacitor. If the two terminals of the capacitor (e.g., the top of the cavity 120A and the terminal 125A) have a separation distance of $d_2$ as illustrated in FIG. 5A, then the capacitance of the first capacitor could be calculated per Equation (1), where A is the surface area in common between the terminal 125A and the top of the cavity 120A, $d_2$ is their separation distance, and $\epsilon$ is the dielectric constant of the void 122A.

$$C = \varepsilon \frac{A}{d_2} \qquad \text{Eq. (1)}$$

In some embodiments, the voids 122A-B may be filled with air, and therefore, the value of $\epsilon$ may be one. In other embodiments, the voids 122A-B may be filled with a foam material. As one example, this foam material may have a dielectric constant between one and two. In still other embodiments, the voids 122A-B may be filled with materials that offer additional structural support to the top of the cavity 120A. For example, the voids 122A-B may be filled with a sponge material that offers additional structural support to the top of the cavity 120A and that aids the top of the cavity 120A in returning to its normal state after being depressed. In still other embodiments, the thickness of the insulator regions 115 may be used to control the separation distance $d_2$.

As can be appreciated from inspection of Equation (1) in conjunction with FIG. 5A, as the housing 105 deforms (e.g., by a user depressing the housing 105), the separation distance $d_2$ decreases and the capacitance of the first capacitor increases. This change in capacitance may be detected by a microprocessor 130 coupled to the first capacitor and translates the change in capacitance into user interaction (detail of the microprocessor 130 operation is given in greater detail below).

Similarly, a second capacitor may be formed by the combination of the top of the cavity 120B, the terminal 125B, and the void 122B. In such an embodiment, the capacitance of the second capacitor could be calculated by Equation (1) where the area A, separation distance $d_2$, and dielectric constant for the second capacitor may be the same as the first capacitor in some embodiments or different than the first capacitor in other embodiments.

FIG. 5A illustrates operation of the housing input mechanism 100 as the housing 105 is depressed by the user 107. (It should be noted that the deformation of the housing 105 may be exaggerated in FIG. 5A for ease of viewing.) The force imparted by the user's 107 finger temporarily bends the top of the cavity 120B with respect to the terminal 125B, pressing the top of the cavity closer to the terminal. Since the top of the cavity 120B represents the top electrode of the second capacitor, the distance $d_2$ may change as the user 107 depresses the housing 105. As the distance $d_2$ changes, the capacitance given by Equation (1) changes, thereby indicating that the housing has been depressed by the user 107.

In some embodiments, the distance $d_2$ may be smaller than the overall thickness of the housing 105. For example, in the embodiments where the housing 105 is manufactured using anodized aluminum that is approximately 0.4 millimeters thick, then the distance $d_2$ may be approximately 0.2 millimeters. In these embodiments, if the housing 105, which has a thickness of 0.4 millimeters, were to flex by 25%, or 0.1 millimeters, this would result in a change of approximately 50% of $d_2$ and the capacitance value, per Equation (1), would increase by 50%. As will be described in greater detail below, the microprocessor 130 may detect this change in capacitance and process it accordingly.

Figure 6:
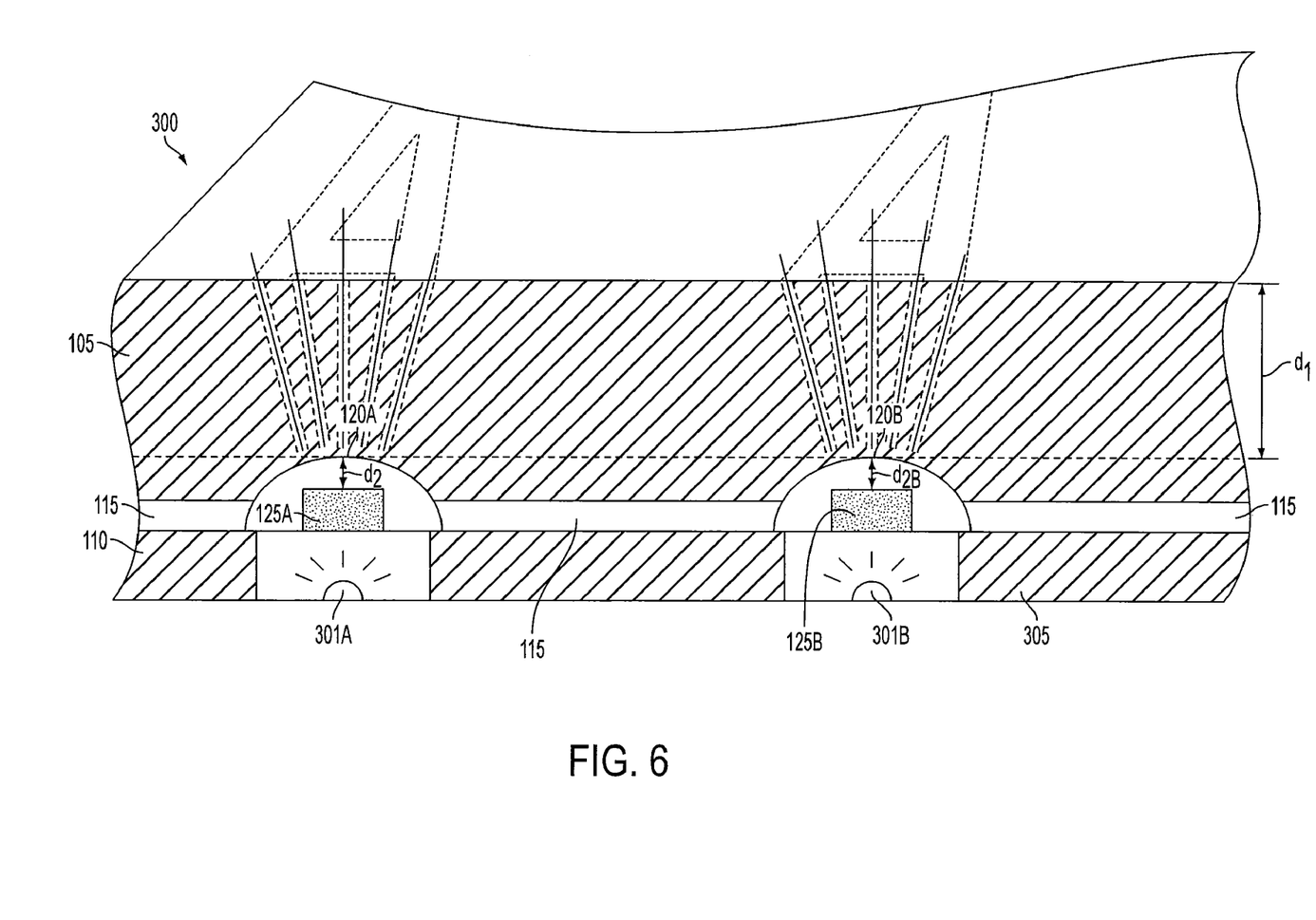
FIG. 6 illustrates a cross section of another housing input mechanism.

While FIG. 5A illustrates one embodiment of the housing input mechanism 100, it should be appreciated that numerous alternate embodiments are possible. For example, FIG. 6 illustrates an alternate housing input mechanism 300 (with the user 107 omitted for the sake of clarity), where the tops of the cavities 120A and 120B are concave. FIG. 6 also illustrates that the housing input mechanism 300 may include one or more illumination devices 301A-B, which in some embodiments, may be located beneath the terminals 125A-B. The housing input mechanism 300 may be configured such that the PCB 305 is coated with a layer of ITO that allows it to be transparent to light. In this manner, light from the illumination devices 301A-B may shine through the housing 105 at a location above the terminals 125A-B as shown in FIG. 6. Note that although the alternate housing input mechanism 300 is shown with the illumination devices 301A-B and alternate shaped cavities 120A and 120B, these embodiments may be implemented independent of one another.

In some embodiments, each of the illumination devices 301A-B may be one or more light emitting diodes (LEDs) of differing colors. For example, in some embodiments, a single LED capable of emitting red, green, and blue (RGB) light separately or simultaneously may be positioned underneath each of the terminals 125A-B. In other embodiments, the single LED may be based on other light combinations such as cyan, yellow, and magenta (CYM), or amber-green, to name but a few. Alternatively, three separate LEDs may be used to provide a mixture of primary colors for emitted light. By mixing these three primary colors, either via a multicolor LED or separate LEDs, a wide variety of resulting colors may be generated individually for each of the terminals 125A-B. In other embodiments, the illumination devices 301A-B may be organic LEDs (OLEDs), and may generate a wide variety of display patterns and colors on each of the surfaces of the housing 105 at a location above the terminals 125A-B.

Because the housing input mechanisms 100 and 300 may be located anywhere on the housing 105 of an electronic device, the ability for the housing input mechanism 300 to illuminate the locations of the terminals 125A-B may be useful. For example, if the housing input mechanism 300 were implemented as the keyboard 28 of the notebook computer 22 (shown in FIG. 2), then the keyboard 28 may appear as a continuous sheet of metal with no indication as to the location of the keys. By illuminating the locations of the terminals 125A-B, however, the key locations may be made know to the user 107.

Figure 7:
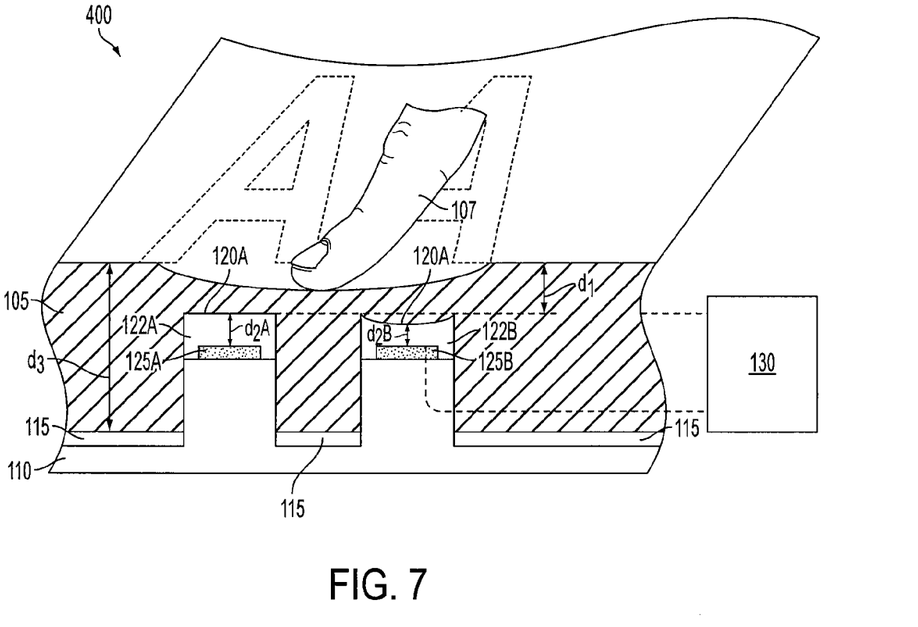
FIG. 7 illustrates a cross section of yet another housing input mechanism.

FIG. 7 illustrates yet another alternative housing input mechanism 400 that may offer enhanced structural stability and reduce the cross contamination between the terminals 125A-B when compared to the housing input mechanism 100 shown in FIG. 5A. As can be appreciated from comparison of FIGS. 5A and 7, the PCB 110 may be thicker in the contact area so that the thickness of the housing 105 over the area of contact (labeled as $d_1$) may remain the same, yet the overall thickness of the housing 105 (labeled as $d_3$ in FIG. 7) may be substantially larger. As one example, the housing thickness may be one to two millimeters. Since the separation distance $d_2$ and the contact area A may be substantially the same between FIGS. 1 and 7, then the measured capacitance may remain substantially the same despite the overall thickness of the housing 105 increasing, thereby adding structural stability. Furthermore, when compared to the embodiment shown in FIG. 5A, this embodiment may reduce the amount of pressure that is intended for the terminal 125A but is transferred to the terminal 125B because the housing 105 may be flexing globally and affecting terminals other than terminal 125A.

Figure 8A:
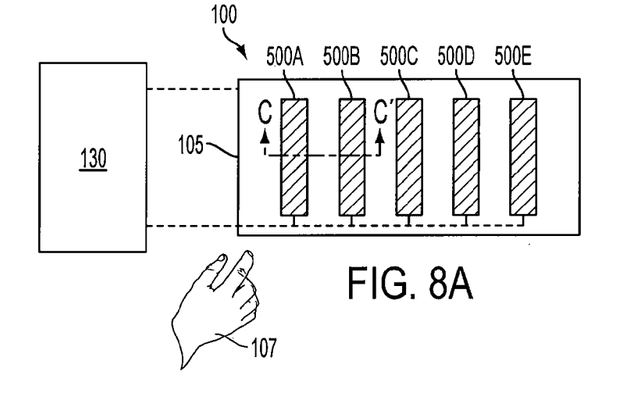
FIG. 8A illustrates a top down view of an arrangement of one or more sensors.

FIGS. 8A-D illustrate top down views of various possible arrangements for the terminals 125A-B located in the housing 105. FIG. 8A includes an array of terminals 500A-E, where each of the terminals 500A-E may be one or more of the terminals 125A-B shown in FIG. 5A and coupled to the microprocessor 130. For example, a line CC' is shown in FIG. 8A to indicate the potential relationship where the terminals 500A-B (top down shown in FIG. 8A) match the terminals 125A-B (cross section shown in FIG. 5A). Similarly, each of FIGS. 8B-D include the line CC' to indicate the possible relationship between the terminals in FIG. 5A and their top down views shown in FIGS. 8B-D. Depending upon the embodiment, the microprocessor 130 may take on a variety of forms. In some embodiments, the microprocessor 130 may be part of, or may be, a general purpose microprocessor located within a computer. In other embodiments, the microprocessor 130 may be a discrete integrated circuit dedicated to monitoring the capacitance changes as the housing 105 is depressed, such as the AD7147 manufactured by Analog Devices, Inc of Norwood, Mass.

As was alluded to above, the microprocessor 130 may be programmed to vary its sensitivity in response to input from the capacitors and/or vary the patterns that are necessary from a user in order for the electronic device to recognize them as user input. For example, in some embodiments, the microprocessor 130 may be configured such that a light tap on the surface of the electronic device may be received as user input. However, in other embodiments, the microprocessor 130 may be configured with a much higher threshold so that the user would have to press much more firmly on the surface of the housing 105 in order for the electronic device to recognize this stress as the same input from the user. In still other embodiments (disclosed more fully below), the microprocessor 130 may be configured to ignore user input unless certain conditions are met, such as the user being located around the electronic device.

Referring still to FIG. 8A, during operation, as the user 107 moves his hand across the surface of the housing 105, the housing 105 may be stressed or deflected over top of the terminals 500A-E in succession, and the microprocessor 130 may detect this as movement in a particular direction. That is, if the user's 107 hand first stresses the housing 105 above the terminal 500A, and then stresses the housing 105 above the terminal 500B, and so on in succession along the housing above the terminals 500C-E, then the microprocessor 130 may determine that the user 107 is moving his hand to the right in FIG. 8A. Similarly, if the user's 107 hand begins stressing the housing above the terminal 500E and continues in succession from the terminal 500D and ultimately to the terminal 500A, then the microprocessor may determine that the user's 107 hand is moving to the left in FIG. 8A. Depending upon the embodiment, the terminals 500A-E may be used to control variable settings of the electronic device. For example, if the electronic device is a personal media player 26, then the terminals 500A-E may be a volume "slider" used to raise or lower the volume levels of the media player 26.

Figure 8B:
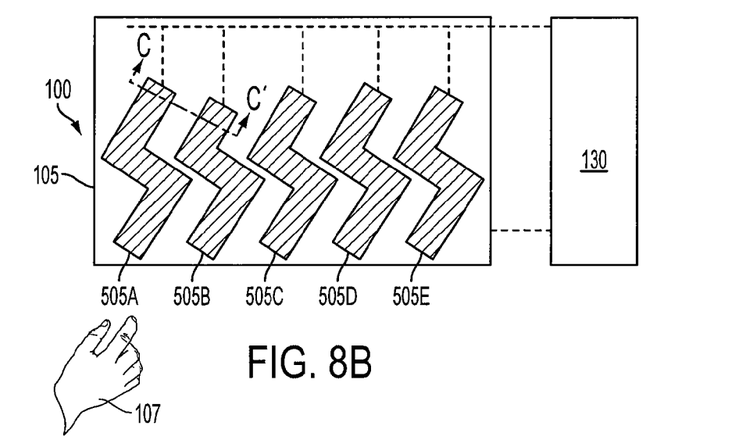
FIG. 8B illustrates a top down view of another arrangement of one or more sensors.

FIG. 8B shows an alternative arrangement with an array of terminals 505A-E in a differing geometric configuration. As shown, the terminals 505A-E may each have a zigzag shape. This may increase the amount of spatial resolution of the capacitance measurements—i.e., a larger signal response between adjacent terminals.

Figure 8C:
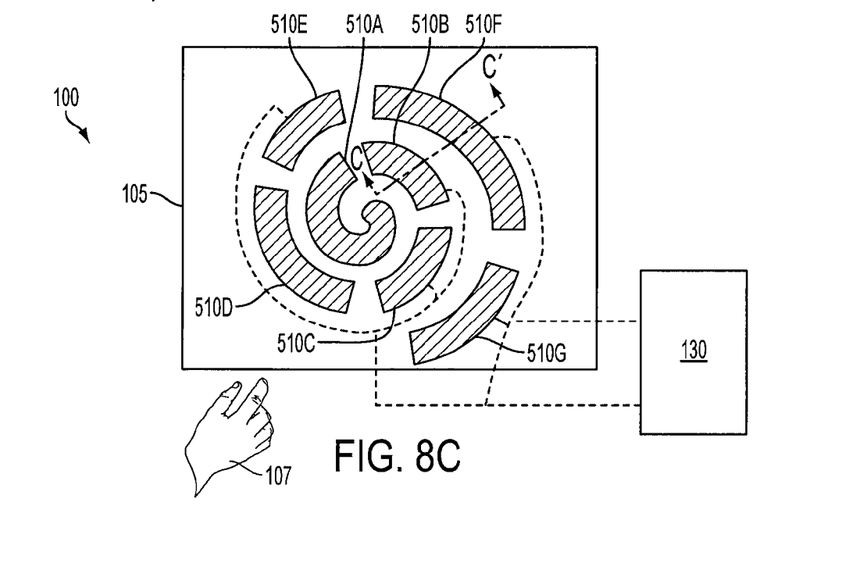
FIG. 8C illustrates a top down view of another arrangement of one or more sensors.

FIG. 8C shows yet another alternative embodiment with the terminals 510A-G in a spiral arrangement. While FIG. 8C illustrates seven terminals 510A-G in a spiral arrangement, any number of terminals may be implemented in the spiral arrangement. In this embodiment, as the user 107 moves his hand across the housing 105 in various directions, the housing 105 above each of the terminals 510A-G may be depressed in a certain successive pattern, and the microprocessor 130 may process the detected patterns to determine a direction of the overall user's 107 movement across the housing 105. For example, in the embodiment shown in FIG. 8C, as the user 107 moves his hand in a diagonal direction from the bottom left of the housing 105 to the top right of the housing 105, then the terminals 510D, 510A, 510B, and 510F may be sensed by the microprocessor 130 in a sequential manner. Similarly, in the embodiment shown in FIG. 8C, as the user 107 moves his hand in a diagonal direction from the bottom right of the housing 105 to the top left of the housing 105, then depression of the terminals 510G, 510C, 510A, and 510E may be sensed by the microprocessor 130 in a sequential manner.

Figure 8D:
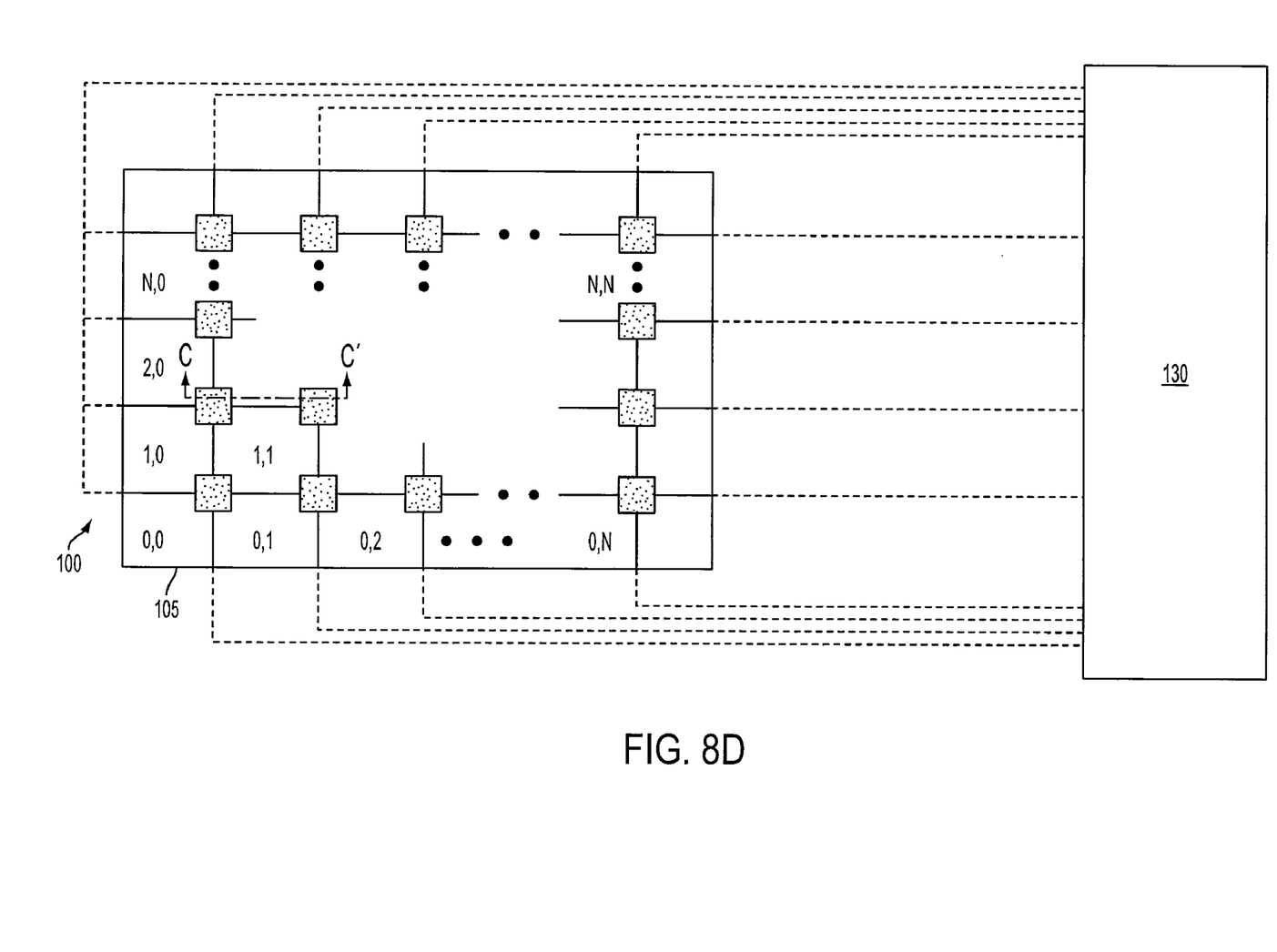
FIG. 8D illustrates a top down view of yet another arrangement of one or more sensors.

FIG. 8D illustrates a top down view of an N×N array of capacitive terminals disposed beneath the housing 105. Arrays of terminals may be used in place of keyboard interfaces in a variety of electronic devices, such as the keyboard 28 of the notebook computer 22 (shown in FIG. 2). In this manner, each of the sensors in the array may be oriented at a distance from each other that generally mimics the layout of a keyboard, thereby allowing the user 107 to type on the housing 105 above the sensors. The embodiment may detect this typing activity in the manner discussed above, namely by sensing a change in the distance between the housing 105 and any sensor underlying the typing, or by sensing a change in the capacitance coupling the housing 105 to an underlying sensor. Some embodiments may disguise the locations of the sensors of the array in the housing 105. In such an embodiment, the electronic device may include one or more illumination devices 301A-B that illuminate when the user makes contact with the housing 105 or positions his fingers or other body part nearby. Each illumination device may correspond, for example, to a separate sensor which may detect impact on or deformation of the housing 105 above it. Thus, given a sufficient number of sensors laid out like the keys of a keyboard, the device housing may be used to input or mimic keystrokes on a keyboard and the N×N array may be used as a keyboard through the housing 105. Furthermore, the housing 105 may include micro-perforations above each of the terminals in the N×N array. Micro-perforations are miniature holes in the housing 105 that are visually imperceptible to the user 107 because of their size yet large enough that, when light is placed behind them, light is visible through the micro-perforations. For example, these micro-perforations may permit light from the illumination devices 301A-B to pass through them to indicate the location of the terminals in the N×N array. In this manner, these micro-perforations may be formed into various shapes, such as letters, numbers, symbols or other features found on the keys of a keyboard so that a keyboard may be formed by the housing 105 by illuminating the illumination devices under each of the terminals in the N×N array. Also, in some embodiments, these micro-perforations may be filled with epoxy.

Other embodiments may compensate for different users operating user interface. For example, in the event that the user interface shown in FIG. 5A is used in place of the traditional keyboard 28, then the electronic device may recognize different users (such as by different login credentials), and customize the stress thresholds of the keyboard 28 accordingly. In this manner, if a first user generally touches the housing more lightly than a second user, then the keyboard 28 may be programmed to have lower stress thresholds when the first user is logged into the electronic device and higher stress thresholds when the second user is logged into the device.

Figure 9:
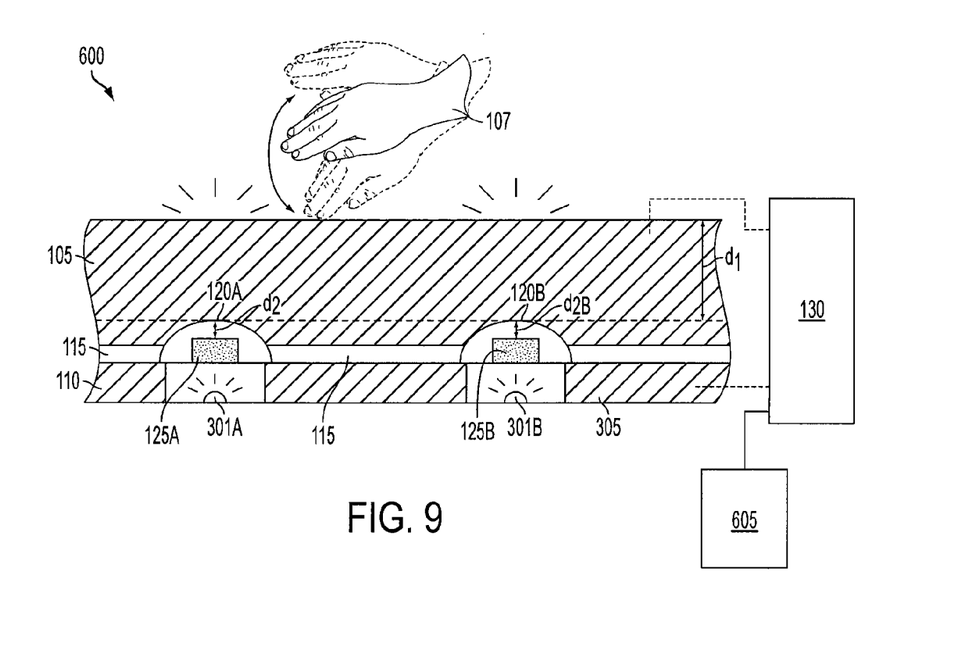
FIG. 9 illustrates a cross section of a housing input mechanism where a user may wave his hand to interface with the electronic device.

The geometric configurations and the potential user 107 input schemes disclosed herein are merely illustrative, and in fact, numerous geometric configurations are possible. Furthermore, while the embodiments disclosed herein may illustrate the user 107 making physical contact with the housing 105 in order to stress or deflect the housing 105 so as to cause a capacitive change measurable by the microprocessor 130, such physical contact may not be necessary in certain embodiments. For example, FIG. 9 illustrates a cross section of a housing input mechanism 600 akin to that shown in FIGS. 1, 6, and 7, except instead of the user 107 making physical contact to stress the housing 105, the user 107 may wave his hand above the housing 105 and air pressure waves from the motion of the hand may cause stress of the housing 105 sufficient enough to cause the microprocessor 130 to register a capacitance change. In these embodiments, in order to selectively increase the sensitivity of the housing input mechanism, the microprocessor 130 may be further coupled to a proximity detector 605, such as an ultrasonic detector located on the housing 105 of the electronic device that emits ultrasonic signals and listens for their reflections when the user 107 is present. By monitoring for presence of the user 107 with a proximity detector 605, the microprocessor 130 may dynamically adjust its sensitivity threshold to air pressure waves such that the microprocessor may register the air pressure waves only when the user 107 is in close proximity to the electronic device and increase its sensitivity threshold otherwise. For example, when the user 107 is holding the electronic device, the proximity detector 605 may reduce the sensitivity threshold to allow the user 107 waving his hand over the housing 105 to cause the microprocessor 130 to perform an action. This ability may allow the housing input mechanism 600 to be implemented as a hidden keyboard, where the illumination devices 301A and/or 301B are illuminated when the user 107 waves his hand over the housing to cause the keys to appear.

Figure 10:
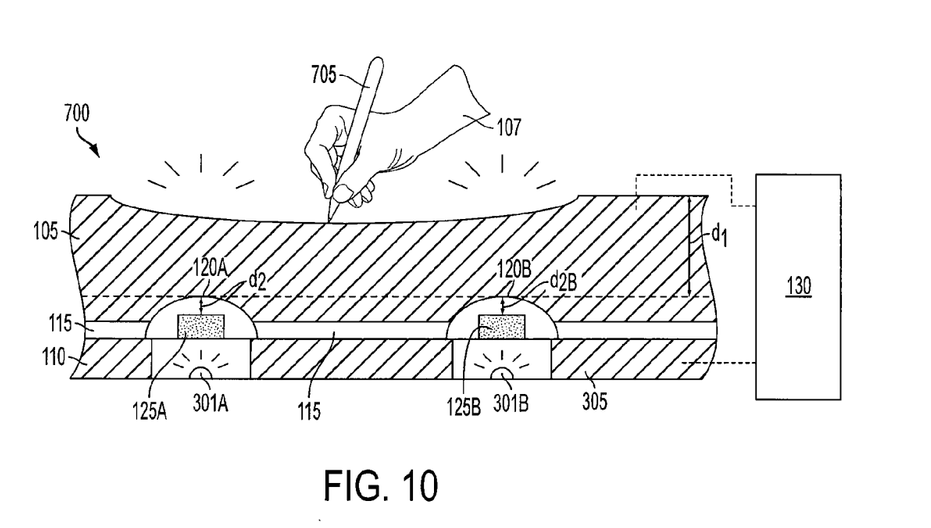
FIG. 10 illustrates a cross section of housing input mechanism where the user may use a stylus to interface with the electronic device.

Other embodiments, such as the housing input mechanism 700 shown in FIG. 10, may include the user 107 making contact with the housing 105 using a stylus 705. For example, when the housing 105 is implemented in the tablet computer 23 or the PDA 25, then the user 107 may depress the housing 105 using the stylus 705 by writing on the tablet computer 23 or the PDA 25 by making contact with the portions 32.

In yet another embodiment, the housing input mechanism 700 may be a mouse, so that the user 107 may move his finger across the surface of the housing 105 in a fashion similar to devices that operate off of the capacitance of a user's body. However, because the housing input mechanism 700 is not based on the capacitance of the user's body, it may be possible to have multiple portions of the user's body (e.g., both left and right forefingers) activating the mouse simultaneously.

In still other embodiments, the housing input mechanism 700 may be implemented as a touch pad, buttons, and/or switches located at various points on the housing 105. For example, the user may turn the PDA 25 (shown in FIG. 2) on by squeezing the portion 29 on the housing.

The housing input mechanisms discussed above may offer several advantages over conventional touch sensing technologies. First, because some conventional touch sensing technologies utilize electrical characteristics of the user 107 (such as the user's 107 capacitance or inductance), conventional touch sensing technologies are often incapable of determining the difference between inadvertent contact by the user 107 and intentional contact by the user 107. For example, if the keyboard 28 described above in the context of FIG. 2 were implemented with conventional touch sensing technologies, then the notebook computer 22 may be unable to detect a subsequent touch by the user 107, such as an intentional keystroke, because the notebook computer 22 may already be detecting the capacitance of the user 107 resting his hands on the keyboard 28. By implementing the housing input mechanism 100 in place of the keyboard 28, the user 107 would be free to rest his hands on the keyboard 28 while typing. Furthermore, in conventional sensing technologies, the user's 107 electrical characteristics (e.g., capacitance or inductance) may be skewed if the user's 107 hands are not clean. That is, if the user 107 has grease, dirt, or sweaty hands, then conventional touch sensing technologies may be unable to accurately estimate contact from the user 107. Because the housing input mechanism 100 is independent of the electrical characteristics of the user 107, it may overcome at least some of the problems associated with conventional touch technologies.

In some embodiments, the sensing through the housing 105 may be combined with capacitive sensing based upon the capacitance of the user's body to ensure that the physical contact with the housing 105 was intentional. For example, referring back to the example discussed above wherein the electronic device is a mobile telephone inside a user's pocket, the housing 105 may be touched unintentionally while in the user's pocket, and the electronic device may inadvertently register this touching as user interaction. To compensate for this possible inadvertent interaction with the housing 105, some embodiments may utilize conventional capacitive sensing (i.e., the capacitance of the user's body), in conjunction with measuring the capacitance changes that result from the user interacting with the housing 105. For example, if the electronic device is a media player 26, then the portion 30 may be a conventional capacitive sensor that detects whether the user is holding the media player 26 while other portions of the media player's 26 housing may be one or more of the housing input mechanisms capable of detecting a user's interaction through the housing as described above.

While some of the embodiments may have been discussed in the context of the user 107 interacting with a portion of the housing 105 that is located substantially over the terminals 125A-B (e.g., FIG. 5A), it should be appreciated that the electronic device may be capable of correctly interpreting the user's 107 interaction that is not located substantially over the terminals 125A-B (e.g., FIGS. 9 and 10). For example, in some embodiments, when the user 107 interacts with the housing 105 in between the terminals 125A-B, the microprocessor 130 may be configured to detect the capacitance of the nearby cells to determine the terminal that the user intended to interact with. To accomplish this, the microprocessor 130 may measure the distance $d_2$ of each of the terminals. In the event that the housing input mechanism 100 is implemented as shown in FIG. 8D and the user 107 depresses the housing 105 at a location in between terminals 0,0 and 0,1, then the microprocessor 130 may be programmed to interpret this depression as a false positive. Similarly, if the user 107 depresses the housing 105 in between all of the terminals 0,0, 0,1, 1,0, and 1,1, yet the depression is closest to the 1,1 terminal, then the microprocessor 130 may sample each of the terminals 0,0, 0,1, 1,0, and 1,1 and determine that the capacitance of the terminal at 1,1 is higher than the rest of the terminals—i.e., its distance $d_2$ is smaller than the others because the depression is closest to the 1,1 terminal. Based upon this higher capacitance, the microprocessor 130 may determine that the user 107 intended to depress the terminal at 1,1 to the exclusion of the other terminals.

Figure 11:
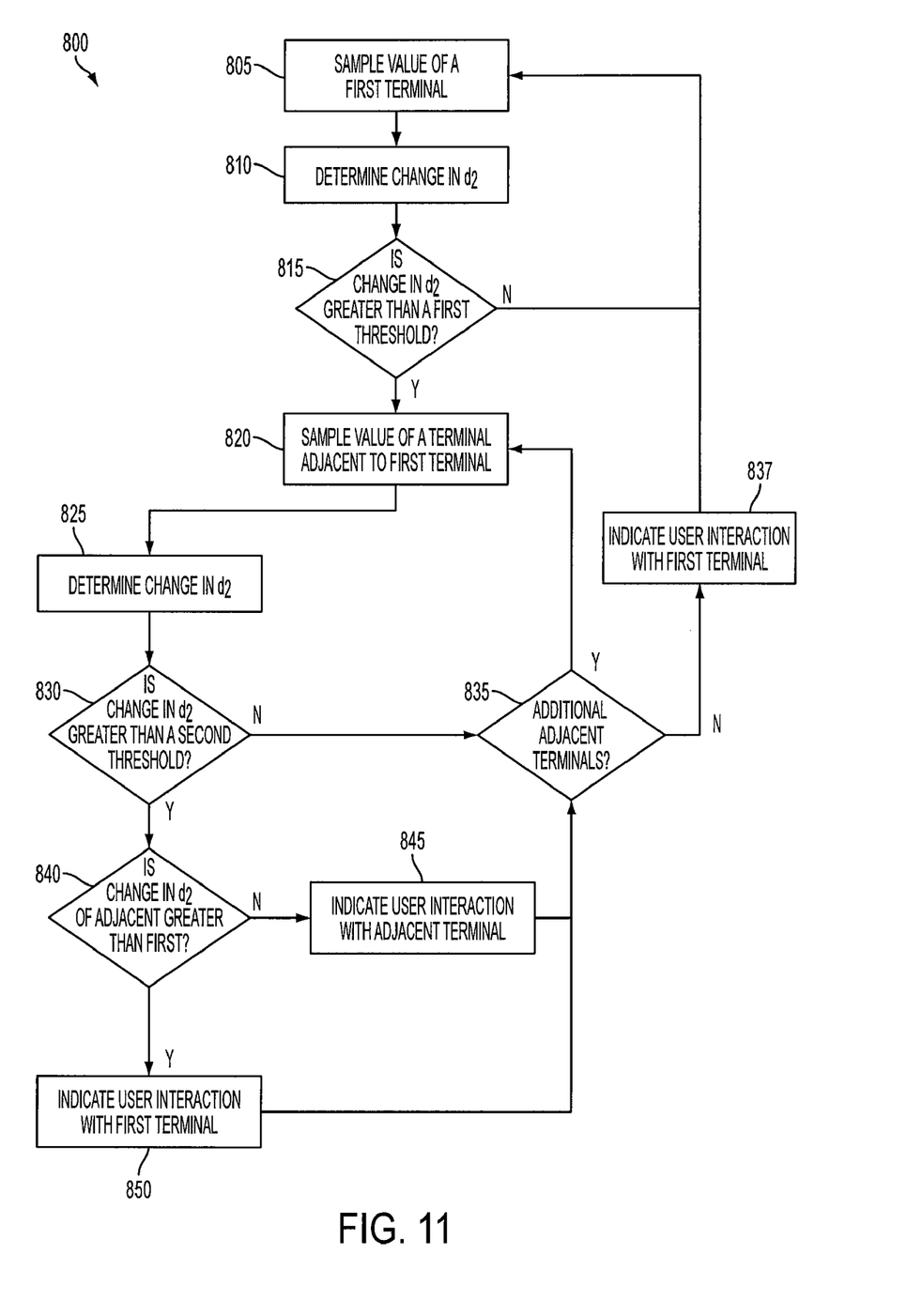
FIG. 11 illustrates an exemplary method used to detect user interaction through one or more housing input mechanisms.

FIG. 11 shows a flow chart illustrating operations 800 of the housing input mechanisms of at least one of the embodiments disclosed above. In some embodiments, the operations 800 may be executed on the microprocessor 130. During operation 805 the microprocessor 130 may sample a value associated with a first terminal, such as the capacitance of the terminal 125A as the housing 105 is depressed in the area over the terminal 125A. The sampled capacitance value may be associated with a change in the thickness of the housing $d_2$ according to Equation (1). This is shown in operation 810.

Next in operation 815, the microprocessor 130 may determine if the change in the thickness of the housing $d_2$ is greater than a predetermined threshold. For example, as was discussed above if the thickness of the housing $d_2$ is 0.2 millimeters, the threshold for operation 815 may be 0.1 millimeters, which may represent a 50% change of thickness because of user interaction.

In operation 820, the microprocessor 130 may sample a terminal adjacent to the first terminal and begin operations to discern which of the terminals the user 107 intended to depress. For example, if the first terminal is terminal 125A shown in FIG. 5A, then the adjacent terminal may be 125B.

Akin to operations 810 and 815, in operations 825 and 830, the microprocessor 130 may determine a change in the thickness of the housing $d_2$ for the adjacent terminal and determine whether this change is greater than a second threshold amount. If the change in the thickness of the housing $d_2$ is not greater than a second predetermined threshold, then the microprocessor 130 may repeat operations 825 and 830 for additional adjacent terminals if they are present per operation 835. Otherwise, if the microprocessor 130 determines in operation 835 that no additional adjacent terminals are available, then the microprocessor 130 may indicate that the user 107 intended to interact with the first terminal per operation 837. Once the microprocessor 130 has determined that the user intended to interact with the first terminal, then per control flowing from operation 837 back to operation 805, the microprocessor 130 may begin to look for a new first terminal in block 805.

Referring back to operation 830, if the change in the thickness of the housing $d_2$ is greater than a second predetermined threshold, then in operation 840, the microprocessor 130 may determine if the change in the thickness of the housing $d_2$ for the adjacent terminal is greater than the change in thickness of the housing $d_2$ for the first terminal. In other words, if the first terminal is the terminal 125A shown in FIG. 5A, and the adjacent terminal is the terminal 125B, then during operation 840, their respective changes in the thicknesses $d_2$ may be compared.

In some embodiments, if the change of thickness $d_2$ for the adjacent terminal is greater than the change in thickness $d_2$ for the first terminal, then the microprocessor 130 may indicate user interaction was intended with the adjacent terminal rather than the first terminal. Alternatively, in the event that the change in thickness $d_2$ for the first terminal is greater than the change in thickness $d_2$ for the adjacent terminal, then the microprocessor 130 may indicate user interaction was intended with the first terminal rather than the adjacent terminal. Once operations 845 and/or 850 have completed, control flows to operation 835 where the microprocessor 130 may determine if additional adjacent terminals are present.

Note that although operations 800 illustrate comparing thresholds of adjacent terminals to determine which terminal the user intended to make contact with, alternative operations are possible. For example, the microprocessor 130 may average the changes in thickness $d_2$ for several adjacent terminals and compare the first terminal's change in thickness with this average instead of directly comparing with the change in thickness $d_2$ for a single adjacent terminal.

What is claimed is:

1. An input-output device, comprising:
a metal surface; and
one or more sensors disposed adjacent the metal surface, wherein the one or more sensors is configured to detect a deflection of the metal surface above a deflection threshold and indicate an input to the input-output device, wherein the deflection threshold is configurable by user input.

2. The input-output device of claim 1, wherein the one or more sensors is a capacitor.

3. The input-output device of claim 1, wherein a thickness of the metal surface is uniform.

4. The input-output device of claim 3, wherein the metal surface is an enclosure of an electronic device.

5. The input-output device of claim 1, wherein a thickness of the metal surface is chosen such that areas of the metal surface proximal to the one or more sensors deflect differently than areas of the metal surface distal to the one or more sensors.

6. An electronic device comprising:
a housing comprising a first region having a first thickness and a second region having a second thickness;
a mounting surface coupled to the housing, the mounting surface comprising a terminal that is located on the mounting surface so that the terminal is substantially aligned with the second region of the housing;
a processing unit coupled to the mounting surface; wherein the processing unit measures an electrical characteristic of the terminal with respect to the housing; and
an illumination source, wherein the housing comprises micro-perforations and wherein light from the illumination source passes through the micro-perforations in the housing.

7. The electronic device of claim 6, wherein the second thickness is thinner than the first thickness.

8. The electronic device of claim 7, wherein the housing and the mounting surface are coupled together such that a cavity exists between the terminal and the housing.

9. The electronic device of claim 8, wherein a capacitor is formed by the combination of the terminal, the housing, and the cavity.

10. The electronic device of claim 9, wherein the cavity is filled with a dielectric material.

11. The electronic device of claim 10, wherein the dielectric material is foam.

12. The electronic device of claim 6, wherein the measured electrical characteristic is capacitance.

13. The electronic device of claim 6, wherein the measured electrical characteristic changes as the second region is stressed with respect to the first region.

14. The electronic device of claim 13, wherein the processing unit quantifies the stress on the second region.

15. The electronic device of claim 14, wherein the electronic device is a phone and an exterior of the housing is capable of being squeezed to control a volume of noise emanating from the phone.

16. An electronic device comprising:
   a housing comprising an exterior that is substantially flat and an interior comprising first and second areas with differing thicknesses;
   a mounting surface coupled to the housing, the mounting surface comprising an illumination source aligned with the second area; and
   a processing unit coupled to the mounting surface;
   wherein the processing unit illuminates the illumination source as the exterior of the housing is stressed.

17. The electronic device of claim 16, wherein the housing is an input mechanism for the electronic device and the processing unit measures a capacitance of the second area with respect to the exterior of the housing.

18. The electronic device of claim 16, wherein the housing is metal.

19. The electronic device of claim 17, wherein the input mechanism is a keyboard and the second area corresponds to a key of the keyboard.

20. The electronic device of claim 17, further comprising a proximity detector, wherein the capacitance is capable of changing without physical contact to the housing when the proximity detector detects the presence of a user.

21. An electronic device comprising:
   a housing comprising an input mechanism integrated into the housing;
   a processing unit coupled to the housing, wherein the input mechanism is activated by stressing a portion of an exterior of the housing; and
   a proximity detector, wherein the act of stressing the portion of the exterior of the housing occurs without physical contact from a user when the proximity detector detects the presence of a user.

22. The electronic device of claim 21, wherein the input mechanism is integrated into a surface of the exterior the housing.

23. The electronic device of claim 21, further comprising an illumination source on the interior of the housing, wherein the act of stressing the portion of the exterior of the housing causes the illumination source to indicate the location of the input mechanism on the exterior of the housing.

24. The electronic device of claim 21, wherein the housing forms a terminal of a capacitor used to measure force imparted by a user onto the housing.

* * * * *